United States Patent
Li et al.

(10) Patent No.: US 6,780,773 B2
(45) Date of Patent: Aug. 24, 2004

(54) METHOD OF CHEMICAL MECHANICAL POLISHING WITH HIGH THROUGHPUT AND LOW DISHING

(75) Inventors: Shijian Li, San Jose, CA (US);
Jui-Lung Li, San Jose, CA (US);
Shi-Ping Wang, Fremont, CA (US);
Gary Lam, Santa Clara, CA (US);
David Mai, San Jose, CA (US); Fred C. Redeker, Fremont, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/193,469

(22) Filed: Jul. 11, 2002

(65) Prior Publication Data

US 2003/0022497 A1 Jan. 30, 2003

Related U.S. Application Data

(60) Provisional application No. 60/304,543, filed on Jul. 11, 2001.

(51) Int. Cl.$^7$ ............................................. H01L 21/641
(52) U.S. Cl. ....................... 438/691; 438/692; 438/693; 438/754
(58) Field of Search ........................... 438/691, 692, 438/693, 622, 754

(56) References Cited

U.S. PATENT DOCUMENTS

| | | | |
|---|---|---|---|
| 5,234,867 A | 8/1993 | Schultz et al. | 437/225 |
| 5,302,233 A | 4/1994 | Kim et al. | 156/636 |
| 5,627,110 A | 5/1997 | Lee et al. | 438/692 |
| 5,676,567 A | 10/1997 | Gluskoter et al. | 439/638 |
| 5,733,177 A | 3/1998 | Tsuchiya et al. | 451/41 |
| 5,738,574 A | 4/1998 | Tolles et al. | 451/288 |
| 5,786,275 A | 7/1998 | Kubo | 438/692 |
| 5,827,781 A | 10/1998 | Skrovan et al. | 438/692 |
| 5,853,604 A | 12/1998 | Kim | 216/88 |
| 5,876,266 A | 3/1999 | Miller et al. | 451/41 |
| 5,897,426 A | 4/1999 | Somekh | 451/41 |

(List continued on next page.)

FOREIGN PATENT DOCUMENTS

| | | | |
|---|---|---|---|
| EP | 1 006 166 A1 | 6/2000 | C09G/1/02 |
| EP | 1 011 131 A1 | 6/2000 | H01L/21/321 |
| EP | 1 085 067 A1 | 3/2001 | C09G/1/02 |
| WO | 00/24842 | 5/2000 | C09G/3/14 |

OTHER PUBLICATIONS

U.S. patent application for 09/469,709 filed on Dec. 21, 1999 (AMAT/3786.Y1).

European Search Report for EP 00 31 1569 dated Nov. 12, 2003 (AMAT/3786.EP).

*Primary Examiner*—Dung Anh Le
(74) *Attorney, Agent, or Firm*—Moser, Patterson & Sheridan

(57) ABSTRACT

Method and apparatus are provided for polishing conductive materials with low dishing of features and reduced or minimal remaining residues. In one aspect, a method is provided for processing a substrate by polishing the substrate to remove bulk conductive material and polishing the substrate by a ratio of carrier head rotational speed to platen rotational speed of between about 2:1 and about 3:1 to remove residual conductive material. In another aspect, a method is provided for processing a substrate including polishing the substrate at a first relative linear velocity between about 600 mm/second and about 1900 mm/second at the center of the substrate, and polishing the substrate at a second relative linear velocity between about 100 mm/second and about 550 mm/second at the center of the substrate.

21 Claims, 4 Drawing Sheets

U.S. PATENT DOCUMENTS

| | | | | |
|---|---|---|---|---|
| 5,952,243 | A | 9/1999 | Forester et al. | 438/693 |
| 5,976,979 | A | 11/1999 | Chen | 438/691 |
| 5,985,748 | A | 11/1999 | Watts et al. | 438/622 |
| 6,001,730 | A | 12/1999 | Farkas et al. | 438/627 |
| 6,024,630 | A | 2/2000 | Shendon et al. | 451/41 |
| 6,068,879 | A | 5/2000 | Pasch | 427/97 |
| 6,083,840 | A | 7/2000 | Mravic et al. | 438/693 |
| 6,113,465 | A | 9/2000 | Kim et al. | 451/41 |
| 6,114,247 | A | 9/2000 | Nakamura et al. | 438/692 |
| 6,117,775 | A | 9/2000 | Kondo et al. | 438/690 |
| 6,121,143 | A | 9/2000 | Messner et al. | 438/692 |
| 6,121,144 | A | 9/2000 | Marcyk et al. | 438/692 |
| 6,136,138 | A | 10/2000 | Yagisawa | 156/345 |
| 6,153,525 | A | 11/2000 | Hendricks et al. | 438/692 |
| 6,156,659 | A | 12/2000 | Roy | 438/692 |
| 6,183,354 | B1 | 2/2001 | Zuniga et al. | 451/285 |
| 6,184,139 | B1 | 2/2001 | Adams et al. | 438/691 |
| 6,184,141 | B1 | 2/2001 | Avanzino et al. | 438/692 |
| 6,187,683 | B1 | 2/2001 | DeSanti et al. | 438/697 |
| 6,217,416 | B1 | 4/2001 | Kaufman et al. | 451/41 |
| 6,244,935 | B1 | 6/2001 | Birang et al. | 451/41 |
| 6,274,478 | B1 | 8/2001 | Farkas et al. | 438/626 |
| 6,276,996 | B1 | 8/2001 | Chopra | 451/41 |
| 6,276,998 | B1 | 8/2001 | Sommer et al. | 451/41 |
| 6,435,942 | B1 | 8/2002 | Jin et al. | 451/8 |
| 6,435,945 | B1 | 8/2002 | Somekh | 451/41 |
| 6,444,569 | B2 | 9/2002 | Farkas et al. | 438/633 |
| 6,451,697 | B1 * | 9/2002 | Sun et al. | 438/691 |
| 6,482,743 | B1 | 11/2002 | Sato | 438/692 |
| 6,569,349 | B1 * | 5/2003 | Wang et al. | 252/79.1 |
| 6,579,153 | B2 * | 6/2003 | Uchikura et al. | 451/41 |
| 6,602,436 | B2 | 8/2003 | Mandigo et al. | 216/88 |
| 6,616,717 | B2 | 9/2003 | Sachan et al. | 51/298 |
| 2001/0004538 | A1 | 6/2001 | Li et al. | 438/200 |
| 2001/0039166 | A1 | 11/2001 | Tran et al. | 451/36 |
| 2002/0058426 | A1 | 5/2002 | Mandigo et al. | 438/792 |
| 2002/0151253 | A1 | 10/2002 | Kollodge et al. | 451/41 |
| 2003/0029841 | A1 | 2/2003 | Moon et al. | 216/89 |

* cited by examiner

METHOD OF CHEMICAL MECHANICAL POLISHING WITH HIGH THROUGHPUT AND LOW DISHING

CROSS-REFERENCE TO RELATED APPLICATIONS

This application claims benefit of U.S. Provisional Patent Application Serial No. 60/304,543, filed Jul. 11, 2001, which is incorporated herein by reference.

BACKGROUND OF THE INVENTION

1. Field of the Invention

Aspects of the invention generally relate to the fabrication of semiconductor devices and to chemical mechanical polishing and planarization of semiconductor devices.

2. Description of the Related Art

Reliably producing sub-half micron and smaller features is one of the key technologies for the next generation of very large-scale integration (VLSI) and ultra large-scale integration (ULSI) of semiconductor devices. However, as the fringes of circuit technology are pressed, the shrinking dimensions of interconnects in VLSI and ULSI technology has placed additional demands on the processing capabilities. The multilevel interconnects that lie at the heart of this technology require precise processing of high aspect ratio features, such as vias, contacts, lines, and other interconnects. Reliable formation of these interconnects is important to VLSI and ULSI success and to the continued effort to increase circuit density and quality of individual substrates and die.

In order to further improve the current density of semiconductor devices on integrated circuits, it has become necessary to use conductive materials having low resistivity for conductors and materials having low dielectric constant (low k, defined herein as having dielectric constants, k, less than about 4.0) as insulating layers to reduce the capacitive coupling between adjacent interconnects. Increased capacitative coupling between layers can detrimentally affect the functioning of semiconductor devices.

One conductive material gaining acceptance is copper and its alloys, which have become the materials of choice for sub-quarter-micron interconnect technology because copper has a lower resistivity than aluminum, (1.7 $\mu\Omega$-cm compared to 3.1 $\mu\Omega$-cm for aluminum), a higher current and higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve a precise pattern. Etching with copper using traditional deposition/etch processes for forming interconnects has been less than satisfactory. Therefore, new methods of manufacturing interconnects having copper-containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, i.e., vias, and horizontal interconnects, i.e., lines. Conductive materials, such as copper-containing materials, and other materials, such as barrier layer materials used to prevent diffusion of copper-containing materials into the surrounding low k dielectric, are then inlaid into the etched pattern. Any excess copper-containing materials and excess barrier layer material external to the etched pattern, such as on the field of the substrate, is then removed.

As layers of materials are sequentially deposited and removed, the uppermost surface of the substrate may become non-planar across its surface and require planarization. Planarizing a surface, or "polishing" a surface, is a process where material is removed from the surface of the substrate to form a generally even, planar surface. Planarization is useful in dual damascene processes to remove excess deposited material and to provide an even surface for subsequent levels of metallization and processing. Planarization may also be used in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates. In conventional CMP techniques, a substrate carrier or polishing head is mounted on a carrier assembly and positioned in contact with a polishing article in a CMP apparatus. The carrier assembly provides a controllable pressure to the substrate urging the substrate against the polishing media. The article is moved relative to the substrate by an external driving force. Thus, the CMP apparatus effects polishing or rubbing movement between the surface of the substrate and the polishing article while dispersing a polishing composition to effect both chemical activity and mechanical activity.

Conventionally, in polishing copper features, such as dual damascene features, the copper-containing material, and a portion of the barrier layer, is polished to the level of the barrier layer, and then the barrier layer is polished, with a portion of the dielectric layer and copper features, to a level of the underlying dielectric layer using abrasive polishing solutions. However, such a polishing process often results in uneven removal of copper in features and the dielectric layer resulting is the formation of topographical defects, such as concavities or depressions in the features, referred to as dishing, and removal of dielectric material surrounding features, referred to as erosion.

FIG. 1 is a schematic view of a substrate illustrating the phenomenon of dishing. Conductive lines 11 and 12 are formed by depositing conductive materials, such as copper or copper alloy, in a feature definition formed in the dielectric layer 10, typically comprised of silicon oxides or other dielectric materials. After planarization, a portion of the conductive material is depressed by an amount D, referred to as the amount of dishing, forming a concave copper surface. Dishing results in a non-planar surface that impairs the ability to print high-resolution lines during subsequent photolithographic steps and detrimentally affects subsequent surface topography of the substrate and device formation. Dishing also detrimentally affects the performance of devices by lowering the conductance and increasing the resistance of the devices, contrary to the benefit of using higher conductive materials, such as copper.

One solution is to polish copper material by using abrasive-free polishing compositions. However, abrasive-free polishing compositions may be unable to sufficiently remove all of the desired copper materials from a substrate surface, such as at the interface between copper and the barrier layer, which is generally non-planar. Such copper materials retained on the substrate surface, or residues, can detrimentally affect device formation, such as creating shortcircuits within or between devices, and thereby reduce device yields and reduce substrate throughput, as well as detrimentally affect the polish quality of the substrate surface.

One solution to ensure removal of all the copper material including copper residues before removing the barrier material is to overpolish the copper and the interface. However, overpolishing of the interface with abrasive-free polishing compositions have not been successful in removing copper residues, and removal of those residues often require extensive polishing times, which have resulted in increased operating costs and decreased substrate throughput.

Therefore, there exists a need for an apparatus, and method that facilitates the removal of copper-containing material from the surface of a substrate with minimal or reduced dishing and with essentially no residues remaining after polishing.

SUMMARY OF THE INVENTION

Aspects of the invention relate generally to methods and apparatus for polishing conductive materials with low dishing of features and essentially no residual conductive material between features. In one aspect, a method is provided for processing a substrate including providing a substrate having a conductive material disposed thereon to a polishing apparatus, polishing the substrate at a first relative linear velocity between about 600 mm/second and about 1900 mm/second at the center of the substrate, and polishing the substrate at a second relative linear velocity between about 100 mm/second and about 550 mm/second at the center of the substrate.

In another aspect, a method is provided for processing a substrate including providing a substrate to a polishing apparatus having one or more rotational carrier heads and one or more rotatable platens, polishing the substrate to remove bulk conductive material, and polishing the substrate by a ratio of carrier head rotational speed to platen rotational speed of between about 2:1 and about 3:1 to remove residual conductive material.

In another aspect, a method is provided for processing a substrate including providing a substrate comprising feature definitions formed in a dielectric layer, a tantalum containing material deposited on the dielectric layer and in the feature definitions, and copper material deposited on the tantalum containing material and filling the feature definitions, to a polishing apparatus having one or more rotational carrier heads and one or more rotatable platens, supplying a first polishing composition to the polishing apparatus at a flow rate of about 200 ml/min or greater, polishing the substrate at a first relative linear velocity between about 600 mm/second and about 1900 mm/second at the center of the substrate to remove bulk copper material, supplying a second polishing composition to the second polishing platen at a flow rate between about 10 ml/min and less than about 110 ml/min, polishing the substrate at a platen rotational speed between about 10 rpms and about 40 rpms and a carrier head rotational speed between about 20 rpms and about 120 rpms to provide a second relative linear velocity between about 100 mm/second and about 550 mm/second at the center of the substrate, wherein the carrier head rotational speed is greater than the platen rotational speed by a ratio of carrier head rotational speed to platen rotational speed of between about 2:1 and about 3:1 to remove residual copper material, and then polishing the substrate to remove the barrier layer.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

In general, aspects of the invention provide methods and apparatus for polishing substrates while reducing dishing of the substrate surface and essentially having no remaining residues. The invention will be described below in reference to a planarizing process for the removal of conductive materials, such as copper-containing materials and barrier layer materials, such as tantalum and tantalum nitride, from a substrate surface by chemical mechanical polishing (CMP) techniques with polishing media. Chemical mechanical polishing is broadly defined herein as polishing a substrate by a combination of both chemical and mechanical activity.

The planarization process that can be carried out using chemical mechanical polishing process equipment, such as the Mirra® CMP System available from Applied Materials, Inc., of Santa Clara, Calif., as shown and described in U.S. Pat. No. 5,738,574, entitled, "Continuous Processing System for Chemical Mechanical Polishing," the entirety of which is incorporated herein by reference to the extent not inconsistent with the invention. Although, the CMP process and composition are illustrated utilizing the Mirra® CMP System, any system enabling polishing using the methods described herein, such as the Reflexion™ CMP System available from Applied Materials, Inc., of Santa Clara, Calif., can be used to advantage. The following apparatus description is illustrative and should not be construed or interpreted as limiting the scope of the invention.

Figure 1:
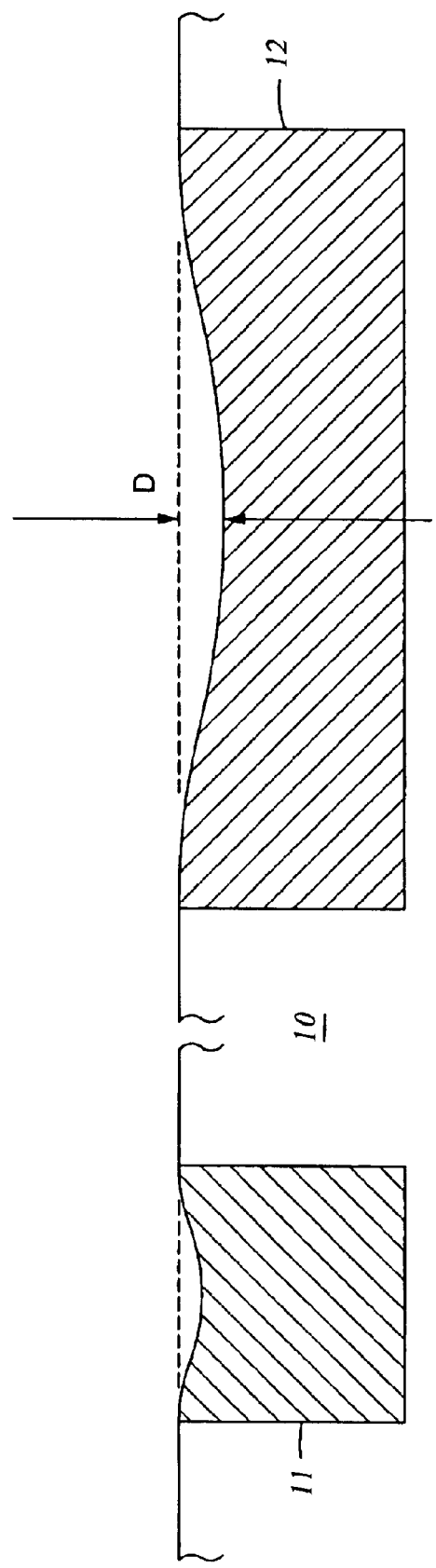
FIG. 1 is a schematic view of a substrate illustrating the phenomenon of dishing.
Figure 2:
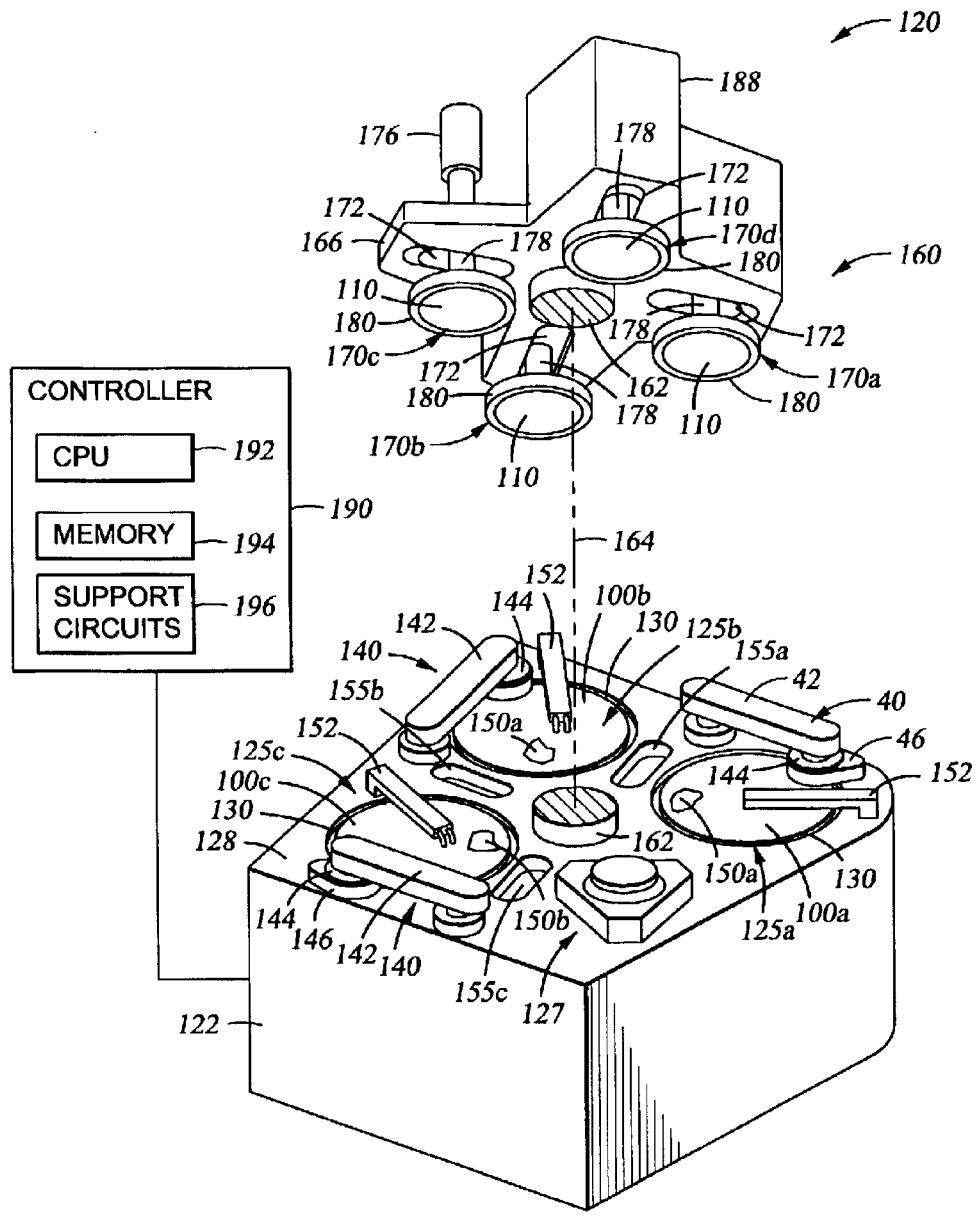
FIG. 2 is a schematic perspective view of a chemical mechanical polishing apparatus.

FIG. 2 is a schematic perspective view of a chemical mechanical polishing system or apparatus 120 for performing the planarizing processes and for use with the CMP compositions described herein. The polishing apparatus 120 includes a lower machine base 122 with a tabletop 128 mounted thereon and a removable outer cover (not shown). The table top 128 supports a series of polishing stations, including a first polishing station 125a, a second polishing station 125b, a final polishing station 125c, and a transfer station 127. The transfer station 127 serves multiple functions, including, for example, receiving individual substrates 110 from a loading apparatus (not shown), washing the substrates, loading the substrates into carrier heads 180, receiving the substrates 110 from the carrier heads 180, washing the substrates 110 again, and transferring the substrates 110 back to the loading apparatus.

A computer based controller 190 is connected to the polishing system or apparatus 120 for instructing the system to perform one or more processing steps on the system, such as polishing a substrate or transferring a substrate in the polishing apparatus 120. In one embodiment, the invention may be implemented as a computer program-product for use with a computer system or computer based controller 190. The programs defining the functions of the preferred embodiment can be provided to a computer via a variety of signal-bearing article and/or computer readable media, which include but are not limited to, (i) information permanently stored on a non-writable storage article (e.g., read-only memory devices within a computer such as read only CD-ROM disks readable by a CD-ROM or DVD drive; (ii) alterable information stored on a writable storage article (e.g., floppy disks within diskette drive or hard-disk drive); or (iii) information conveyed to a computer by a communications medium, such as through a computer or telephone network, including wireless communication. Such signal-bearing media, when carrying computer-readable instructions that direct the functions of the invention, represent alternative embodiments of the present invention. It may also be noted that portions of the product program may be developed and implemented independently, but when combined together are aspects described herein.

Each polishing station 125*a*–125*c* includes a rotatable platen 130 having polishing media, such as polishing pads 100*a*, 100*b*, or 100*c* disposed thereon. The polishing pad is a polishing pad having a durable roughened surface typically composed of microporous polyurethane or polyurethane mixed with filler. Polishing pads 100*a*, 100*b* and 100*c* may be embossed or stamped with a pattern to improve distribution of slurry across the face of the substrate. Polishing pads 100*a*, 100*b* and 100*c* may include a hard polishing material, a soft polishing material, or combinations thereof.

A hard polishing material is broadly described herein as a polishing material having a polishing surface of a hardness of about 50 or greater on the Shore D Hardness Scale for polymeric materials as described and measured by the American Society for Testing and Materials (ASTM), headquartered in Philadelphia, Pa. A suitable hard polishing material is a material comprising the IC-1000, IC-1010, and the IC-1400 polishing pads available from Rodel Inc., of Phoenix, Ariz. (IC-1000 is a product name of Rodel, Inc.)

The polishing pads 100*a*, 100*b*, and 100*c* may also include composite pads of one or more layers, with a surface layer having a hardness of about 50 or greater on the Shore D Hardness Scale. The composite pads may have an overall hardness of less than about 50 on the Shore D Hardness Scale. While the description herein describes the use of the IC series of pads from Rodel Inc., the invention is equally applicable to all polishing pads having the hardness described herein.

A hard polishing material is broadly described herein as a polishing material having a polishing surface of a hardness of less than about 50 on the Shore D Hardness Scale for polymeric materials as described and measured by the American Society for Testing and Materials (ASTM), headquartered in Philadelphia, Pa. The soft polishing pad may be composed of a napped poromeric synthetic material, such as a uniformly compressible material including a polymeric material, i.e., plastic, and/or foam, felt, rubber, or a combination thereof. An example of a soft polishing material is polyurethane impregnated with felt. An example of a soft polishing pad is the Politex or Suba series, ie., Suba IV, of polishing pads available from Rodel, Inc. (Politex and Suba are tradenames of Rodel, Inc.)

Alternatively, polishing pads 100*a*, 100*b*, 100*c* may be a standard two-layer pad in which the upper layer has a durable roughened surface and is harder than the lower layer. For example, the upper layer of the two-layer pad may be composed of microporous polyurethane or polyurethane mixed with filler, whereas the lower layer maybe composed of compressed felt fibers leached with urethane. Both the upper and lower layers may be approximately fifty mils thick. A two-layer standard pad, with the upper layer composed of IC-1000 and the lower layer composed of SUBA-4, is available from Rodel (IC-1000 and SUBA-4 are product names of Rodel, Inc.).

In one embodiment of the apparatus, the first polishing station 125*a* has a first hard polishing pad for the first polishing pad 100*a* disposed on a platen 130, and the platen 130 disposed thereon is adapted for polishing a substrate to remove bulk copper-containing material disposed on the substrate. The second polishing station 125*b* has a second hard polishing pad for the second polishing pad 100*b* disposed on a platen 130, and the platen 130 disposed thereon is adapted for polishing a substrate to remove residual copper-containing material disposed on the substrate. A third polishing station 125*c* having a soft polishing pad for the polishing pad 100*c* may be used for a barrier removal process, such as removing a tantalum containing material, e.g., tantalum and tantalum nitride, on the substrate and dielectric layer buffing following the two-step copper removal process.

A rotatable linear platen may be used for the second polishing station 125*b*. An example of a linear polishing system, and an example of a polishing system having a rotatable polishing pad and a rotatable linear platen, is more fully described in co-pending U.S. patent application Ser. No. 09/244,456, filed on Feb. 4, 1999, and incorporated herein by reference to the extent not inconsistent with the invention. Alternatively, a stationary platen or a rotatable or linear platen having a stationary article may be used for the first, second, or third, polishing stations 125*a*, 125*b*, and 125*c*.

The invention also contemplates the use of an orbital polishing process or orbital polishing platen for the first, second, and/or third polishing stations 125*a*, 125*b*, and 125*c*. A substrate and polishing article can be moved in an orbital relative motion in a linear drive system where the article is stationary; an example of an apparatus capable of performing the orbital relative motion between the polishing article and substrate is the Model 8200, available from Applied Materials Inc., of Santa Clara, Calif.

Each platen 130 may be a rotatable aluminum or stainless steel platen connected to a platen drive motor (not shown). The polishing stations 125*a*–125*c* may include a pad conditioner apparatus 140. The pad conditioner apparatus 140 has a rotatable arm 142 holding an independently rotating conditioner head 144 and an associated washing basin 146. The pad conditioner apparatus 140 maintains the condition of the polishing pad so that it will effectively polish the substrates. Each polishing station may include a conditioning station if the CMP apparatus is used with other article configurations.

The polishing stations 125*a*–125*c* may each have a composition delivery/rinse arm 152 that includes two or more supply tubes to provide one or more CMP compositions, cleaning compositions, and/or water to the surface of the polishing media. The composition delivery/rinse arm 152 delivers the one or more chemical slurries in amounts sufficient to cover and wet the entire polishing media. Each composition delivery/rinse arm 152 also includes several spray nozzles (not shown) that can provide a high-pressure fluid rinse on to the polishing article at the end of each polishing and conditioning cycle. Furthermore, two or more intermediate washing stations 155a, 155b, and 155c may be positioned between adjacent polishing stations 125a, 125b, and 125c to clean the substrate as it passes from one station to the next.

A rotatable multi-head carousel 160 is positioned above the lower machine base 122. The carousel 160 includes four carrier head systems 170a, 170b, 170c, and 170d. Three of the carrier head systems receive or hold the substrates 110 by pressing them against the polishing pads 100 disposed on the polishing stations 125a–125c. One of the carrier head systems 170a–170d receives a substrate from and delivers a substrate 110 to the transfer station 127. The carousel 160 is supported by a center post 162 and is rotated about a carousel axis 164 by a motor assembly (not shown) located within the machine base 122. The center post 162 also supports a carousel support plate 166 and a cover 188.

The four carrier head systems 170a–170d are mounted on the carousel support plate 166 at equal angular intervals about the carousel axis 164. The center post 162 allows the carousel motor to rotate the carousel support plate 166 and orbit the carrier head systems 170a–170d about the carousel axis 164. Each carrier head system 170a–170d includes one carrier head 180. A carrier drive shaft 178 connects a carrier head rotation motor 176 (shown by the removal of one quarter of the cover 188) to the carrier head 180 so that the carrier head 180 can independently rotate about its own axis. There is one carrier drive shaft 178 and motor 176 for each head 180. In addition, each carrier head 180 independently oscillates laterally in a radial slot 172 formed in the carousel support plate 166.

The carrier head 180 performs several mechanical functions. Generally, the carrier head 180 holds the substrate 110 against the polishing pads 100, evenly distributes a downward pressure across the back surface of the substrate 110, transfers torque from the drive shaft 178 to the substrate 110, and ensures that the substrate 110 does not slip out from beneath the carrier head 180 during polishing operations.

To facilitate control of the system as described above, the controller 190 may include a CPU 192 of FIG. 2, which CPU 192 may be one of any form of computer processors that can be used in an industrial setting for controlling various chambers and subprocessors. The memory 194 is coupled to the CPU 192. The memory 194, or computer-readable medium, may be one or more of readily available memory such as random access memory (RAM), read only memory (ROM), floppy disk, hard disk, or any other form of digital storage, local or remote. For storing information and instructions to be executed by the CPU 192.

The support circuits 196 are coupled to the CPU 192 for supporting the processor in a conventional manner. These circuits include cache, power supplies, clock circuits, input/output circuitry and subsystems, and can include input devices used with the controller 190, such as keyboards, trackballs, a mouse, and display devices, such as computer monitors, printers, and plotters. Such controllers 190 are commonly known as personal computers; however, the present invention is not limited to personal computers and can be implemented on workstations, minicomputers, mainframes, and supercomputers.

A process, for example a polishing process described below, is generally stored in the memory 194, typically as a software routine. The software routine may also be stored and/or executed by a second CPU (not shown) that is remotely located from the hardware being controlled by the CPU 192.

Although the process of the present invention is discussed as being implemented as a software routine, some or all of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

Chemical Mechanical Polishing Process

Methods are provided for planarizing a substrate surface in a two-step process including a first polishing step to remove bulk conductive material and a second polishing step to remove residual conductive material. The substrate may then be polished to remove a barrier layer disposed on the substrate surface exposed during conductive material removal.

In one aspect, the two-step process may include polishing a substrate in a first step by a ratio of carrier head rotational speed to platen rotational speed of about 1:1 and polishing a substrate in a second step by having a carrier head rotational speed greater than a platen rotational speed of a ratio of carrier head rotational speed to platen rotational speed of between about 2:1 and about 3:1. The difference in the carrier head rotational speed and platen rotational speed may also be characterized by the carrier head rotational speed being between about 100% and about 200% greater than the platen rotational speed or may be characterized as the carrier head rotational speed being between about 2 and about 3 times greater than the platen rotational speed.

The first polishing step typically provides a first relative linear velocity between about 600 mm/second and about 1900 mm/second, which results in effective removal of bulk conductive materials, and the second polishing step typically provides a second relative linear velocity between about 100 mm/second and about 550 mm/second for effective removal of any residual conductive materials.

The relative linear velocity of the substrate is usually considered the linear velocity at the center of the substrate. For a rotating substrate, the average relative linear velocity typically increases when measured further from the center of the substrate. Additionally, the relative linear velocity of the substrate increases as the substrate is moved from the center of a rotating polishing media. An example of a relative linear velocity at the rotational speeds and rotational speed ratios described herein may produce a linear velocity between about 100 mm/second and about 550 mm/second at the center of a substrate displaced approximately 12.5 cm to 13 cm from the rotating polishing article axis.

Polishing may be enhanced by delivering a polishing composition in the first step at a flow rate of about 200 ml/min or greater and delivering the polishing composition at a flow rate between about 10 ml/min and about 50 ml/min during the second polishing step.

Bulk conductive material is broadly defined herein as conductive material deposited on the substrate in an amount sufficient to fill features formed on the substrate surface and cover about 25% or more of the surface area of the substrate. Bulk material is generally deposited to a sufficient thickness to cover the entire substrate surface above a dielectric layer. Bulk conductive material may include copper-containing material, for example, copper, copper alloys, and/or doped copper.

Residual conductive material is broadly defined as any conductive material that covers about 25% or less of the surface area of the substrate. The residual material is generally present in an amount covering between about 5% and about 10% of the surface area of a substrate after one or more polishing process steps using abrasive containing or abrasive-free polishing compositions with conventional polishing pads to remove bulk material from the substrate surface. Residual conductive material may include copper-containing material, for example, copper, copper alloys, copper oxide, and/or doped copper.

Substrate surface that may be polished by the processes described herein having bulk conductive material formed thereon are generally formed by having a dielectric layer with feature definitions formed therein, depositing a barrier layer generally on the dielectric layer and in the feature definitions, and depositing the conductive material, such as the copper-containing material, in sufficient amounts to fill the feature definitions formed therein.

As used throughout this disclosure, the phrase "copper-containing material", "copper" and the symbol Cu are intended to encompass high purity elemental copper as well as doped copper and copper-based alloys, e.g., doped copper and copper-based alloys containing at least about 80 wt. % copper. The barrier layer material includes tantalum, tantalum nitride, and derivatives thereof, such as tantalum silicon nitride. The invention described herein also contemplates the use of other barrier materials known or unknown that may be used as a barrier with conductive materials known or unknown, such as copper, that may be used if forming semiconductor features.

The dielectric layer can comprise any of various dielectric materials known or unknown that may be employed in the manufacture of semiconductor devices. For example, dielectric materials, such as silicon dioxide, phosphorus-doped silicon glass (PSG), boron-phosphorus-doped silicon glass (BPSG), and carbon-doped silicon dioxide, can be employed. The dielectric layer can also comprise low dielectric constant materials, including fluoro-silicon glass (FSG), polymers, such as polymides, and carbon-containing silicon oxides, such as Black Diamond™, available from Applied Materials, Inc. of Santa Clara, Calif. The openings are formed in interlayer dielectrics by conventional photolithographic and etching techniques. The invention also contemplates the use of dielectric materials, known or unknown, that may be used as dielectric layers in semiconductor fabrication.

While the invention is described in relation to a two-step polishing process, the steps described herein should not be construed or interpreted as limiting the practice or scope of the invention. For example the two-step process may be performed as part of one distinct continuous operation, may have overlapping processing during change from the bulk copper removal step to the residual removal step, or may be performed on two or more separate platens.

While the following process described herein illustrates polishing the substrate on three platens, the invention contemplates polishing the substrate by the process described herein on apparatus having one, two, four, or multiple platens. For example, the two-step polishing process for the conductive material and the barrier polishing step described herein may be performed on a single platen if desired by the operator. Further, the invention contemplates that the steps may be performed on the same platens or that portions of some process steps may be performed on multiple platens. For example, the polishing process may be performed removing a portion of the bulk conductive material on a first polishing platen and removing a remaining amount of bulk conductive material and residual conductive material on a second polishing platen.

Additionally, while the following processing parameters are generally described for polishing 200 mm substrates, the invention contemplates modifying processing parameters to satisfy the requirements for polishing substrates of different sizes, such as 300 mm substrates, and polishing on various apparatus, such as orbital motion polishing apparatus. The process described below should be considered illustrative, and should not be construed or interpreted as limiting the scope of the invention.

Multi-Step Processing

In one embodiment of the invention, a multi-step planarizing process for removing conductive materials and conductive material residues from a substrate surface is provided. In a first step, an abrasive or abrasive-free polishing composition is contacted with a polishing article to remove bulk copper-containing material from the substrate surface disposed on a platen at a ratio of carrier head rotational speed to platen rotational speed of about 1:1. In a second step, an abrasive-free polishing composition is then contacted with a polishing article disposed on a platen at a carrier head rotational speed greater than a platen rotational speed by a ratio of carrier head rotational speed to platen rotational speed of between about 2:1 and about 3:1. The residual removal process advantageously stops on the underlying barrier layer, i.e., is selective to the copper, thereby planarizing the surface of the substrate.

The substrate may then be further processed. For example, a barrier layer polishing composition is used with a polishing article to remove the barrier layer typically disposed above a dielectric layer. The barrier layer polishing composition may selectively remove the barrier layer in relation to the copper and dielectric materials, i.e., remove the barrier layer at higher removal rates than the copper or dielectric materials, or the barrier layer composition may non-selectively remove the copper, barrier, and dielectric materials at approximately equal rates. The substrate may then be rinsed on the following barrier layer removal to remove surface defects and particles adhering to the substrate surface. The above processing steps may be performed on the same apparatus or may be performed on more than one apparatus. Additionally, the substrate may be transferred to a cleaning module or subjected to an in situ cleaning process to also remove surface defects, such as oxides that form on the copper-containing material.

Carrier head and platen rotational speeds less than 100 rpms, and, optionally, chemical flow rates of about 100 ml/min or less may be used to enhance removal of residual copper-containing material with the processes described herein.

Figure 3:
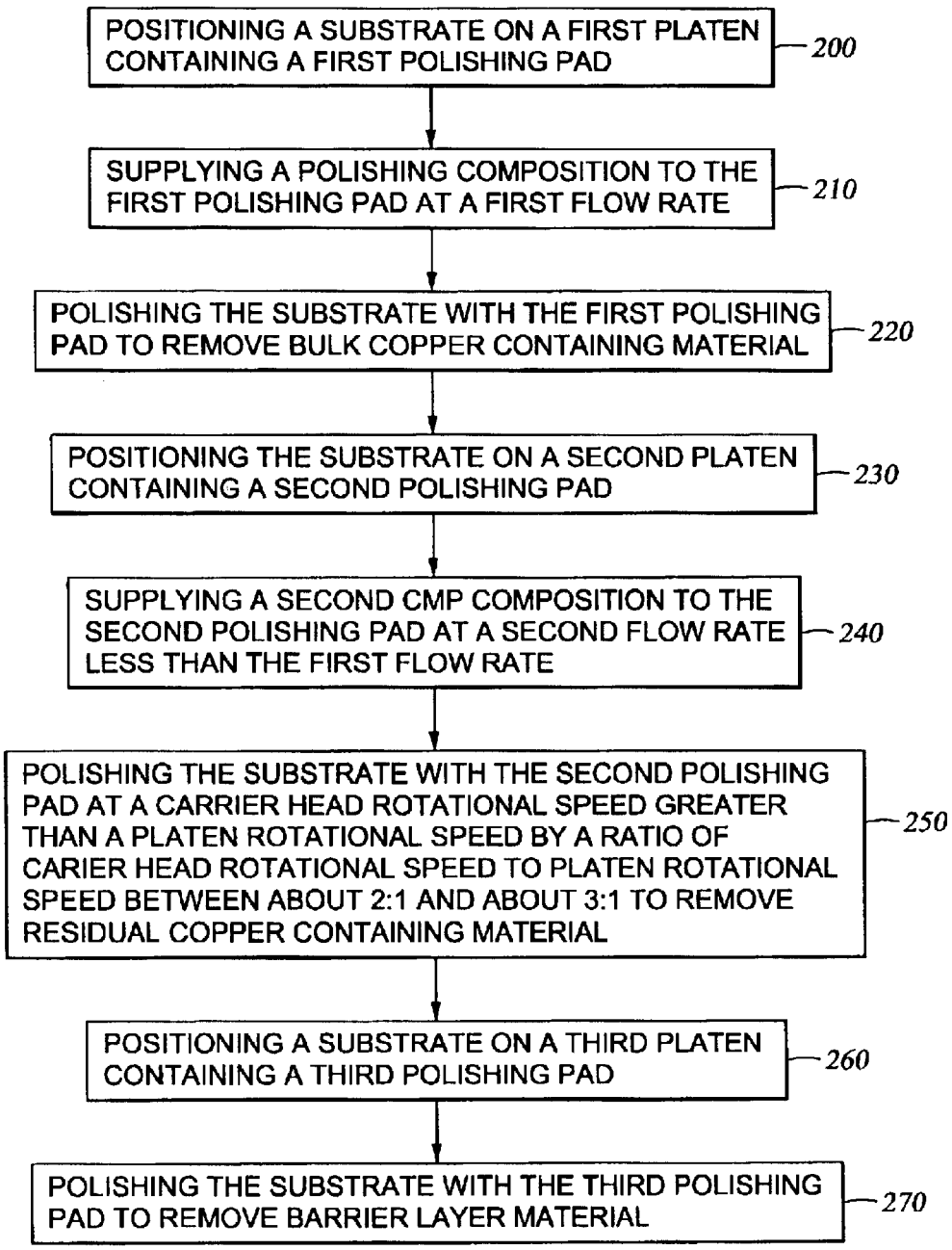
FIG. 3 is a flow chart illustrating the processing steps according to one embodiment of the invention.

FIG. 3 is a flow chart illustrating one embodiment of a process to remove copper-containing materials in the two-step planarization process described above and barrier layer removal. In a first step, a substrate is positioned on a first platen containing a polishing pad 100 disposed on platen 130 in polishing station 125a at step 200. A first polishing composition is supplied to the polishing pad 100a at step 210. At least a portion of the bulk copper-containing materials is then removed from the surface of the substrate by polishing the substrate at step 220.

In the polishing process at step 220, the carousel 160 positions the substrate in contact with the polishing pad 100a, and the substrate and the polishing pad move relative to one another with the composition distributed between to effect chemical and mechanical activity on the substrate, and then the substrate is typically removed from contact with the polishing pad 100a.

The polishing pad 100a disposed on the substrate is rotated at a rate between about 50 rpms and about 150 rpms for a polishing pad disposed on rotatable platen 125a. The substrate disposed in a carrier head system 170 is rotated at a rotational speed between about 50 rpms and about 150 rpms. Typically, a rotational speed between about 80 rpms and 100 rpms for both the carrier head and the platen, for example 93 rpms and 87 rpms respectively, has been used to remove bulk material from the substrate surface. The polishing article and substrate are generally rotated in the same direction. At the carrier head and platen rotational speeds, the substrate is polished with a relative linear velocity between about 600 mm/second and about 1900 mm/second at the center of the substrate.

The bulk copper polishing composition is delivered or supplied to the polishing pad at a flow rate of about 200 ml/min or greater from a storage medium disposed near the CMP apparatus. Typically, a flow rate of between about 200 ml/min and about 300 ml/min may be supplied to the polishing pad for polishing the substrate. A pressure between about 2 psi and about 6 psi is generally applied between the substrate and the polishing article during the polishing process. If low dielectric constant materials are used, a polishing pressure of between about 0.5 psi and about 2 psi may be used, for example about 1 psi. Examples of suitable polishing compositions, including abrasive-containing polishing compositions and abrasive-free polishing compositions, commercially available for removing copper-containing material in the first polishing step include HS-C430-A3, HS-C430-A1, HSC430-A22, HS-C430-A33, available from Hitachi Chemical Corp. of Japan. The abrasive-containing polishing composition may have up to about 1 wt. %, for example, up to about 0.1 wt. %, of abrasives. In one aspect of the polishing composition, a polishing composition having between about 0.1 wt. % and about 0.5 wt. % may be used.

The substrate and the polishing pad are typically exposed to the polishing composition and contacted for a period of time sufficient to remove at least a portion or all of the bulk copper-containing material disposed thereon. For example, the polishing pad may be exposed to the first polishing composition between about 60 seconds and about 180 seconds, but may vary depending upon the material being removed, the concentration of the components of the first polishing composition, and the amount or thickness of bulk copper-containing material on the substrate. The copper-containing material may be removed at a rate between about 4000 Å/min and about 8,000 Å/min or any rate to remove the bulk copper-containing materials deposited on the substrate.

The substrate may then be positioned on a second platen containing a second polishing pad 100b at step 230, and includes positioning the substrate on the polishing pad 100b at polishing station 125b. A second polishing composition is supplied to the polishing pad 100b at step 240. Any remaining bulk copper-containing materials and residual copper-containing materials are then removed from the surface of the substrate. The process described herein for bulk copper removal may be applied to the second platen to remove any of the remaining bulk copper material on the second platen prior to removal of the residual material.

In the second process step, the residual material may then be removed by polishing the substrate with a carrier head rotational speed greater than a platen rotational speed by a ratio of carrier head rotational speed to platen rotational speed of between about 2:1 and about 3:1 at step 250. The second process step includes having the carousel 160 position the substrate in contact with the polishing pad 100b, and the substrate and the polishing pad 100b move relative to one another with the composition distributed therebetween to effect affect chemical and mechanical activity on the substrate, and then the substrate is typically removed from contact with the polishing pad 100b.

The polishing pad 100 is rotated at a rate between about 10 rpms and about 40 rpms for a polishing pad disposed on a rotatable platen. The substrate disposed in a carrier head system 170 is rotated at a rotational speed ratio between about 2:1 and about 3:1 greater than the polishing pad rotating speed. For example, the substrate is rotated at a carrier head rotational speed between about 20 rpms and about 120 rpms when the polishing pad rotated at a platen rotational speed between about 10 rpms and about 40 rpms. A carrier head rotational speed between about 60 rpms and about 90 rpms and a platen rotational speed between about 15 rpms and about 30 rpms have been observed to sufficiently remove residual materials for a 200 mm polisher. Generally, the ratio between carrier head rotational speed and platen rotational speed is about 3:1 when polishing a 200 mm substrate.

The rotational speed value may vary for a 300 mm substrate polisher, for example, a carrier head rotational speed of about 30 rpms and a platen rotational speed of about 15 rpms for a 300 mm polisher, such as the Reflexion™ chemical mechanical polisher commercially available from Applied Materials, Inc., of Santa Clara Calif. Generally, the ratio between carrier head rotational speed and platen rotational speed is about 2:1 when polishing a 300 mm substrate.

The rotational rates and ratio of rotational rates result in polishing the substrate with a relative linear velocity between about 100 mm/second and about 550 mm/second at the center of the substrate at the rotational speed ratio and rotational speeds disclosed herein.

A contact pressure between about 2 psi and about 6 psi between the substrate and the polishing pad is used to provide mechanical activity to the polishing process. If low dielectric constant materials are used, a polishing pressure of between about 0.1 psi and about 2.5 psi may be used, for example between about 1 and about 2.5 psi, or alternatively, between about 0.1 psi and about 1.5 psi, depending on the low k material used and the desired processing rates.

The second polishing composition may be delivered or supplied to the polishing pad 100 at a lower flow rate than in the first polishing step. Generally, the second polishing composition is delivered at a flow rate between about 10 ml/min and about 100 ml/min. A polishing composition flow rate of between about 70 ml/min and 80 ml/min has been used to polish the substrate surface at the rotational speeds described in this step. The same or different polishing composition may be used for the first and second polishing steps for removing copper-containing materials. An example of an abrasive-free polishing composition that may be used in the second polishing step. An example of a commercially available polishing composition includes HS-C430-A3, commercially available from Hitachi Chemical Corp. of Japan. Alternatively, abrasives may be added to the composition in a concentration up to about 1 wt. %, for example, up to about 0.1 wt. %, of abrasives. In one aspect of the polishing composition, a polishing composition having between about 0.1 wt. % and about 0.5 wt. % may be used.

The substrate and the polishing article are typically exposed to the second polishing composition for a period of time sufficient to remove the residual copper-containing materials disposed thereon and provide for any overpolishing of the substrate surface to further remove defects formed thereon. For example, the polishing article may be exposed to the second polishing composition between about 60 seconds and about 180 seconds, but may vary depending upon the material being removed, the concentration of the components of the second polishing composition, and the amount or thickness of residual copper material on the substrate.

It has been observed that the two-step copper polishing process described above reduces dishing and reduces or eliminates the presence of residual materials on the substrate surface during chemical mechanical polishing of the substrate surface.

The substrate is then positioned on a third platen containing a polishing pad 100c at step 260, and may include positioning a substrate on the third polishing pad 100c disposed on platen 130 in polishing station 125c. A barrier removal polishing composition is then supplied to the polishing pad 100 and barrier layer materials, such as tantalum containing materials, are then removed from the surface of the substrate by a polishing process on the substrate at step 270. The barrier removal polishing composition may be contain up to about 5 wt. % of abrasive particles. For example, the barrier removal composition may have up to about 1 wt. %, such as, up to about 0.1 wt. %, of abrasives. In one aspect of the polishing composition, a polishing composition having between about 0.1 wt. % and about 0.5 wt. % may be used The polishing pad 100c is rotated at a rate between about 50 rpms and about 120 rpms for a polishing pad disposed on a rotatable platen. The substrate disposed in a carrier head system 170 is rotated at a rate between about 50 rpms and about 120 rpms. The polishing pad and substrate are rotated in the same direction to provide a relative motion between one another. A pressure between about 0.5 psi and about 6 psi between the substrate and the polishing pad 100c is used to provide mechanical activity to the polishing process. If low dielectric constant materials are used, a polishing pressure of between about 0.5 psi and about 2 psi may be used, for example about 1.5 psi.

The barrier layer polishing composition is delivered or supplied to the polishing pad at a flow rate of about 200 ml/min or greater from a storage medium disposed near the CMP apparatus. Examples of suitable polishing compositions commercially available for removing barrier layer material in the third polishing step include HS-T605 and HS-T505, available from Hitachi Chemical Corp. of Japan. The substrate and the polishing pad are typically exposed to the polishing composition and contacted for a period of time sufficient to remove the barrier layer material, for example between about 60 seconds and about 180 seconds. The barrier layer materials may be removed at a rate up to about 1200 Å/min.

Optionally, a cleaning solution may be applied to each of the polishing pads during or subsequent to each of the polishing processes to remove particulate matter and spent reagents from the polishing process as well as help minimize metal residue deposition on the polishing pads and defects formed on a substrate surface. An example of a suitable cleaning solution is Electra Clean™ commercially available from Applied Materials, Inc., of Santa Clara, Calif. Typically, the cleaning solution is used on the third platen following polishing of the substrate.

Additionally, the polishing pad may be conditioned after one or more substrates have been polished on the respective polishing platens. The platens may be conditioned for about 60 seconds or less. For example, the first platen, which removes bulk copper may be conditioned for 30 seconds, the second platen, which removes residual bulk material, may be conditioned for 15 seconds, and the third platen, which may be used for buffing and barrier removal, may be conditioned for 0 seconds.

It was discovered by the inventors herein that polishing substrates with platen and carrier head rotational speeds described herein at the ratio of rotational speeds described herein and in combination with low polishing composition flow rates compared to prior art polishing flow rates, can effectively remove residual materials from a substrate surface. This is unexpected because it has been observed that reduced composition flow rate will greatly reduce the removal rate of bulk copper materials, and that rotational speeds of less than 50 rpms are commonly accepted as ineffective in removing bulk copper material from the substrate surface. Additionally, it has been observed that rotational speeds of less than 50 rpms and relative rotational speeds between the polishing pad and the substrate of greater than about 50% have produced mechanical and process instability in polishing substrates.

It is further believed that the rotational speeds described herein and the ratio of rotational speeds provide a relative linear velocity to the substrate surface, which results in removal of residual conductive materials at increased removal rates, further enhanced by reduced polishing composition flow rates, compared to previous polishing processes. The recognition of the relative linear velocity as a characterization of the ability to remove residual materials allow the process to be modified for use with alternative processes and systems, such as a non-rotary surface, e.g., a linear polishing system, using a sliding or circulating polishing belt or similar device, which can produce relative linear velocities between a rotating substrate surface and the polishing media.

Figure 4:
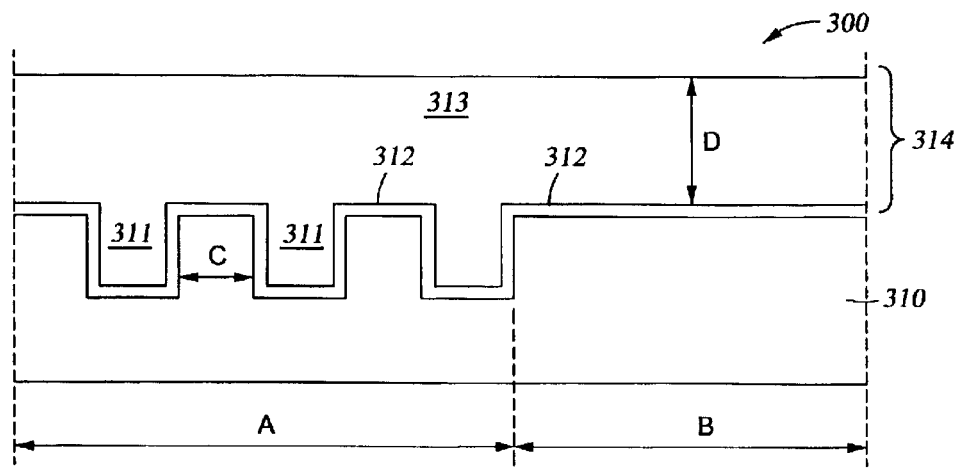
FIGS. 4–6 are schematic diagrams of a substrate illustrating one embodiment of a process for planarizing the dielectric layer described herein.
Figure 5:
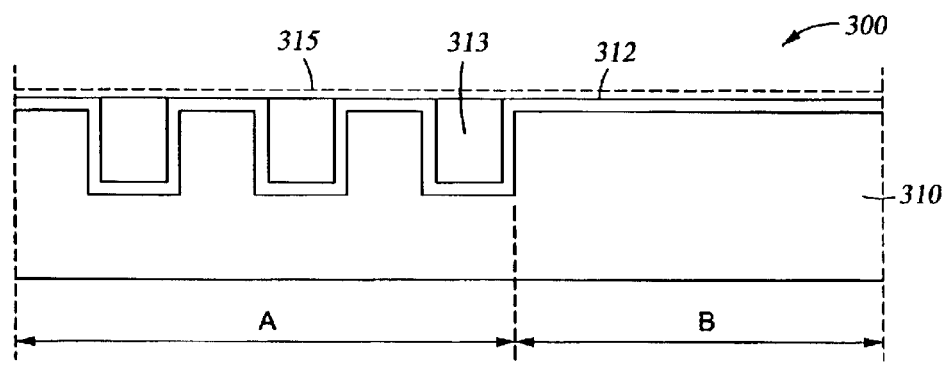
Figure 6:
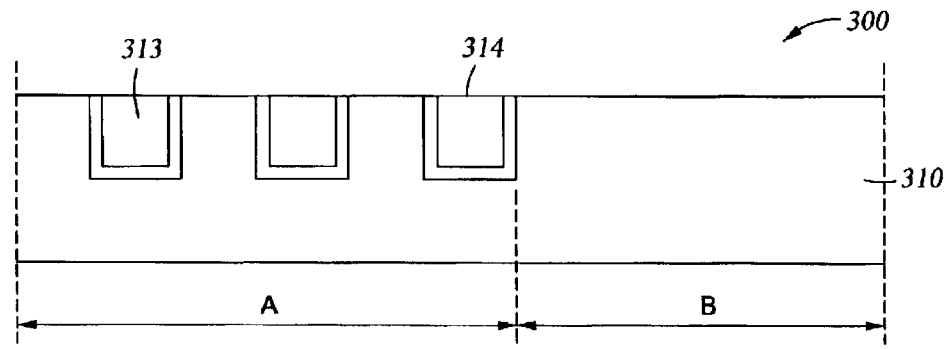

FIGS. 4–6 are a series of schematic cross-sectional views of a substrate illustrating sequential phases of a process for forming an in-laid metallization pattern utilizing the two-step planarization process described herein.

Referring to FIG. 4, the substrate includes a dielectric layer 310, such as a silicon oxide or a carbon-doped silicon oxide, formed on a substrate 300. A plurality of openings 311 patterned and etched into the dielectric in area A forming features for a dense array of conductive lines with area B being unetched. Typically, the openings 311 are spaced apart by a distance C which can be less than about 1 micron, such as about 0.2 micron, or greater than 10 microns, such as 20 microns. The openings 311 were formed in the dielectric layer 310 by conventional photolithographic and etching techniques. A barrier layer 312 of a conductive material, such as Ta or TaN for a copper metallization, is disposed in openings 311 and on the upper surface of the dielectric layer 310. A copper layer 313 is disposed on the barrier layer at a thickness (D) between about 8,000 Å and about 18,000 Å.

Referring to FIG. 5, the bulk copper material 314 of the copper layer 313 is removed using a CMP copper polishing process described herein. The first CMP composition removes the copper layer 313 to the tantalum barrier layer 312. However, residual copper-containing material 315 may remain on the substrate following the bulk copper-containing material removal process. To remove the residual copper-containing material, an abrasive-free CMP composition is used with an abrasive-free polishing pad by the residual material polishing process described herein, which allows for effective removal of the copper layer 313 to the tantalum layer 312, minimizes dishing of the copper layer 313, and minimizes formation of a non-planar surface.

Referring to FIG. 6, the barrier layer is removed by a third polishing process. The barrier layer removal process typically removes the barrier layer 312 from the substrate 300 while minimizing dishing of any copper material 313 filling the apertures, and typically stops on the dielectric layer to prevent excessive etching of the dielectric material, thereby completing planarization. Additionally, the dielectric layer 310 may be polished or buffed during the barrier layer CMP process to remove or reduce scratching or defects formed on the substrate surface non-selectively. The resulting copper features comprises a dense array (A) of copper lines 313 bordered by open field B and the planar surface 314 of the copper metallization and substrate 300.

EXAMPLES

An example of a three-step polishing process according to aspects of the invention described herein is as follows. A 200 mm substrate including a dielectric material with feature definitions formed therein, a tantalum barrier layer deposited on the dielectric layer and in the feature definitions formed therein, and a copper-containing layer deposited on the barrier layer and filling the feature definitions formed therein is provided to the polishing apparatus disclosed above.

The substrate is positioned over an IC-1000 polishing pad of a first platen, and a polishing composition of HS-C430-A3, commercially available from Hitachi, is delivered to the polishing pad at a flow rate of about 210 ml/min. The platen is rotated at a speed of about 93 rpms, the carrier head is rotated at a speed of about 87 rpms, and a pressure of about 5 psi is applied between a substrate and polishing pad. The substrate is then polished for a requisite amount of time at a rate between about 4000 Å/minute and about 8,000 Å/minute to sufficiently remove the bulk of the copper-containing material.

If a low k dielectric material is used in fabricating the substrate, the following process parameters may be used. HS-C430-A3 polishing composition from Hitachi is provided at a flow rate of about 200 ml/min, the platen is rotated at a speed of about 93 rpms, the carrier head is rotated at a speed of about 87 rpms, and a pressure of about 2 psi is applied between a substrate and polishing pad to remove the bulk copper material.

The substrate is positioned over an IC-1000 polishing pad of a second platen, and the same or a similar polishing condition for bulk copper removal is applied to completely remove the bulk copper material. Afterwards, a polishing composition of HS-C430-A3, commercially available from Hitachi, is delivered to the polishing pad, at a flow rate of about 80 ml/min, the platen is rotated at a speed of about 30 rpms, the carrier head is rotated at a speed of about 90 rpms, and a pressure of about 5 psi is applied between a substrate and polishing pad. The substrate is then polished for a requisite amount of time to sufficiently remove the residual copper material.

If a low k dielectric material is used in fabricating the substrate, the following process parameters may be used. HS-C430-A3 polishing composition from Hitachi is provided at a flow rate of about 70 ml/min, the platen is rotated at a speed of about 20 rpms, the carrier head is rotated at a speed of about 60 rpms, and a pressure of about 2 psi is applied between a substrate and polishing pad to remove the residual copper material.

The substrate is then transferred to a third platen having a Politex polishing pad disposed thereon, and a barrier layer polishing composition is delivered to the polishing pad to remove the barrier layer material and planarize the surface of the substrate. An example of the composition for the third platen is HS-T605, commercially available from Hitachi, is provided at a flow rate of about 200 ml/min, the platen is rotated at a speed of about 93 rpms, the carrier head is rotated at a speed of about 87 rpms, and a pressure of about 2 psi is applied between a substrate and polishing pad to remove the residual copper material. The substrate is then polished for a requisite amount of time at a rate up to about 1200 Å/minute to sufficiently remove the barrier layer materials. The substrate may then be buffed or rinsed on the same or the third hard pad, and then cleaned using a suitable cleaning solution, such as Electra Clean™ commercially available from Applied Materials, Inc., of Santa Clara, Calif.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
   providing a substrate having a conductive material disposed thereon to a polishing apparatus having one or more rotational carrier heads and one or more rotatable platens;
   polishing the substrate at a first relative linear velocity between about 600 mm/second and about 1900 mm/second at the center of the substrate; and
   polishing the substrate at a second relative linear velocity between about 100 mm/second and about 550 mm/second at the center of the substrate and at a ratio of carrier head rotational speed to platen rotational speed of between about 2:1 and about 3:1.

2. The method of claim 1, wherein the first relative linear velocity is between about 1000 mm/second and about 1200 mm/second at the center of the substrate.

3. The method of claim 1, wherein the second relative linear velocity is between about 250 mm/second and about 400 mm/second at the center of the substrate.

4. The method of claim 1, wherein the first relative linear velocity removes bulk conductive material from the substrate surface and the second relative linear velocity removes residual conductive material from the substrate surface.

5. The method of claim 4, wherein polishing with the first relative linear velocity is performed on a first polishing platen and polishing with the second relative linear velocity is performed on a second polishing platen.

6. The method of claim 4, wherein polishing with the first relative linear velocity is performed on a first polishing platen to remove a portion of the bulk conductive material and on a second platen to remove a remaining amount of bulk conductive material, and the second relative linear velocity is performed on a second polishing platen to remove residual conductive material by a second polishing article disposed on a second polishing platen.

7. The method of claim 1, further comprising supplying a polishing composition at a flow rate between about 10 ml/min and about 100 ml/min during residual conductive material removal.

8. The method of claim 1, wherein the conductive material comprises copper, doped copper, copper alloys, or combinations thereof.

9. The method of claim 1, wherein the second linear velocity is provided by a platen rotational speed between about 10 rpms and about 40 rpms and a carrier head rotational speed between about 20 rpms and about 120 rpms.

10. A method for processing a substrate having a conductive material disposed thereon, comprising:
    providing a substrate to a polishing apparatus having one or more rotational carrier heads and one or more rotatable platens;
    polishing the substrate to remove bulk conductive material at a first relative linear velocity; and then polishing the substrate at a second relative linear velocity less than the first relative linear velocity by a ratio of carrier head rotational speed to platen rotational speed of between about 2:1 and about 3:1 to remove residual conductive material, wherein the second relative linear velocity is between about 100 mm/second and about 550 mm/second at the center of the substrate.

11. The method of claim 10, wherein the bulk conductive material is removed by a first polishing article disposed on a first polishing platen and the residual conductive material is removed by a second polishing article disposed on a second polishing platen.

12. The method of claim 10, wherein a portion of the bulk conductive material is removed by a first polishing article disposed on a first polishing platen and a remaining amount of bulk conductive material and the residual conductive material is removed by a second polishing article disposed on a second polishing platen.

13. The method of claim 10, wherein a carrier head rotational speed is between about 50 rpms and about 150 rpms and a platen rotational speed is between about 50 rpms and about 150 rpms during bulk conductive material removal.

14. The method of claim 10, wherein the first relative linear velocity is between about 600 mm/second and about 1900 mm/second at the center of the substrate.

15. The method of claim 10, wherein the platen rotational speed is between about 10 rpms and about 40 rpms and the carrier head rotational speed is between about 20 rpms and about 120 rpms during residual conductive material removal.

16. The method of claim 10 wherein the first relative linear velocity is between about 1000 mm/second and about 1200 mm/second and the second relative linear velocity is between about 250 mm/second and about 400 mm/second.

17. The method of claim 10, further comprising supplying a polishing composition at a flow rate between about 10 ml/min and about 100 m/min during residual conductive material removal.

18. The method of claim 10, wherein the conductive material comprises copper, doped copper, copper alloys, or combinations thereof.

19. A method for processing a substrate, comprising:

providing a substrate comprising feature definitions formed in a dielectric layer, a tantalum containing material deposited on the dielectric layer and in the feature definitions, and copper material deposited on the tantalum containing material and filling the feature definitions, to a polishing apparatus having one or more rotational carrier heads and one or more rotatable platens;

supplying a first polishing composition to the polishing apparatus at a flow rate of about 200 ml/min or greater;

polishing the substrate at a first relative linear velocity between about 600 mm/second and about 1900 mm/second at the center of the substrate to remove bulk copper material;

supplying a second polishing composition to the second polishing platen at a flow rate between about 10 ml/min and less than about 100 ml/min;

polishing the substrate at a platen rotational speed between about 10 rpms and about 40 rpms and a carrier head rotational speed between about 20 rpms and about 120 rpms to provide a second relative linear velocity between about 100 mm/second and about 550 mm/second at the center of the substrate, wherein the carrier head rotational speed is greater than the platen rotational speed by a ratio of carrier head rotational speed to platen rotational speed of between about 2:1 and about 3:1 to remove residual copper material; and then polishing the substrate to remove the barrier layer.

20. The method of claim 19, wherein the bulk conductive material is removed on a first polishing platen and the residual conductive material is removed on a second polishing platen.

21. The method of claim 19, wherein a portion of the bulk conductive material is removed on a first polishing platen and a remaining amount of bulk conductive material and the residual conductive material is removed on a second polishing platen.

* * * * *

UNITED STATES PATENT AND TRADEMARK OFFICE
CERTIFICATE OF CORRECTION

PATENT NO. : 6,780,773 B2 Page 1 of 1
DATED : August 24, 2004
INVENTOR(S) : Li et al.

It is certified that error appears in the above-identified patent and that said Letters Patent is hereby corrected as shown below:

Column 6,
Line 4, should read -- mixed with filler, whereas the lower layer may be composed... --

Column 7,
Line 49, should read -- storage, local or remote, for storing information and instructions... --

Column 11,
Line 66, please delete "effect".

Column 17,
Line 38, should read -- ml/min and about 100 ml/min during residual conductive... --

Signed and Sealed this

Fourteenth Day of June, 2005

JON W. DUDAS
*Director of the United States Patent and Trademark Office*